US009865983B2

(12) United States Patent
Su et al.

(10) Patent No.: US 9,865,983 B2
(45) Date of Patent: Jan. 9, 2018

(54) VCSEL INCORPORATING A SUBSTRATE HAVING AN APERTURE

(71) Applicant: Avago Technologies General IP (Singapore) Pte. Ltd., Singapore (SG)

(72) Inventors: Chung-Yi Su, Fremont, CA (US); Christine Chen, San Jose, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/841,636

(22) Filed: Aug. 31, 2015

(65) Prior Publication Data

US 2017/0063040 A1 Mar. 2, 2017

(51) Int. Cl.
*H01S 5/00* (2006.01)
*H01S 3/08* (2006.01)
(Continued)

(52) U.S. Cl.
CPC ...... *H01S 3/08059* (2013.01); *H01S 3/08068* (2013.01); *H01S 5/022* (2013.01); *H01S 5/0207* (2013.01); *H01S 5/0267* (2013.01); *H01S 5/02288* (2013.01); *H01S 5/183* (2013.01); *H01S 5/18305* (2013.01); *H01L 2224/16225* (2013.01); *H01L 2224/48091* (2013.01); *H01L 2224/73265* (2013.01); *H01S 5/005* (2013.01); *H01S 5/02248* (2013.01); *H01S 5/0425* (2013.01); *H01S 5/18308* (2013.01); *H01S 5/18355* (2013.01)

(58) Field of Classification Search
CPC ...... H01S 5/18397; H01S 5/183; H01S 5/022; H01S 5/0267; H01S 3/08059; H01S 3/08068; H01S 5/18302; H01S 5/3402; H01S 5/02469
See application file for complete search history.

(56) References Cited

U.S. PATENT DOCUMENTS 5,020,066 A * 5/1991 Iga ............... H01S 5/18308
372/45.01
5,633,527 A 5/1997 Lear
(Continued)

OTHER PUBLICATIONS

Akira Higuchi, titled "High Power Density Vertical-Cavity Surface-Emitting Lasers with ion implanted isolated current aperture," Dec. 1, 2011, published in Optics Express.

*Primary Examiner* — Yuanda Zhang

(57) ABSTRACT

A vertical cavity surface emitting laser (VCSEL) includes a substrate having an aperture that allows light generated in an active layer of the VCSEL to exit the VCSEL after propagation through a first set of semiconductor layers. The VCSEL further includes an opaque bottom layer that blocks light generated in the active layer and propagated through a second set of semiconductor layers. The opaque bottom layer can be attached to a heat sink for heat dissipation thereby allowing the VCSEL to be operated at high power levels. The active layer is sandwiched between the first set of semiconductor layers and the second set of semiconductor layers. Unlike a traditional VCSEL where only certain wavelengths of light can propagate through a solid substrate that is "transparent" to these particular wavelengths, the aperture provided in the substrate of a VCSEL in accordance with the disclosure allows for propagation of many different wavelengths.

25 Claims, 8 Drawing Sheets

(51) Int. Cl.
*H01S 5/022* (2006.01)
*H01S 5/183* (2006.01)
*H01S 5/026* (2006.01)
*H01S 5/02* (2006.01)
*H01S 5/042* (2006.01)

(56) References Cited

U.S. PATENT DOCUMENTS

| | | | | |
|---|---|---|---|---|
| 6,123,465 | A | * | 9/2000 | Hashizume .......... G02B 6/4204 385/34 |
| 2002/0176468 | A1 | * | 11/2002 | Kaneko ................ H01S 5/0264 372/50.23 |
| 2003/0185267 | A1 | * | 10/2003 | Hwang ............... H01S 5/18358 372/96 |
| 2004/0042518 | A1 | * | 3/2004 | Tatum ................ H01S 5/18341 372/50.11 |
| 2005/0286597 | A1 | | 12/2005 | Mukoyama |
| 2008/0247436 | A1 | * | 10/2008 | Carter ................. H01S 5/0264 372/50.11 |
| 2016/0349469 | A1 | * | 12/2016 | Kase ................... G02B 6/4244 |

* cited by examiner

VCSEL INCORPORATING A SUBSTRATE HAVING AN APERTURE

FIELD OF THE INVENTION

The invention generally relates to semiconductor lasers, and more particularly relates to a vertical cavity surface emitting laser (VCSEL).

BACKGROUND

Medium to high-power semiconductor lasers are highly desirable in a wide variety of optical applications. More particularly, high-power near-infrared lasers operating at wavelengths ranging from around 760 nm to around 900 nm are desirable for a number of applications such as active night-vision devices and three-dimensional (3D) imaging devices.

Among the various types of lasers available for such applications, one type of laser that is generally referred to in the industry as an edge-emitting Fabry-Perot (FP) laser, can satisfy some requirements pertaining to high power optical output. However, high-power edge-emitting FP lasers are susceptible to catastrophic failures, for example as a result of the high optical power density at the light emitting facet. The manufacturing cost of high-power edge-emitting FP lasers also tends to be high as a result of various post-wafer fabrication processing steps that are difficult to scale up to satisfy high volume manufacturing. Furthermore, the output laser beam of a high-power edge-emitting FP laser can be undesirably divergent and consequently difficult to align to a target object.

Another type of laser that is generally referred to in the industry as a vertical cavity surface emitting laser (VCSEL), addresses some of the shortcomings associated with the edge-emitting FP laser. For example, unlike the edge-emitting FP laser where the optical power density is concentrated over a small area at the light emitting facet, the optical power density in a VCSEL is distributed over a significantly larger lateral surface area thereby providing better device reliability. Also, VCSELs can be manufactured in high volume as a result of various factors such as testability of multiple VCSELs at a wafer level. Such testing is in contrast to manufacture-related testing of edge-emitting FP lasers that can only be carried out upon individual devices after singulation of a semiconductor wafer.

With further reference to VCSELs, VCSELs are typically manufactured in two flavors—"top-emission" VCSELs and "bottom-emission" VCSELs. "Top-emission" VCSELs suffer from various handicaps that hinder their use in high power optical applications. Such handicaps include their inability to satisfy heat dissipation requirements associated for example, with lasing current confinement in an active region of the device.

On the other hand, "bottom-emission" VCSELs can be used in applications where "junction-down" soldering is permissible for more efficient heat-sinking during high-power operation. In this type of VCSEL, light emission takes place through a substrate that constitutes a top surface of the device. However, as a result of light having to propagate through the substrate, "bottom-emission" VCSELs are typically limited to operating over certain wavelengths at which light can propagate through the material of the substrate. In other words, the substrate material has to be "transparent" to these optical wavelengths and such a requirement places a limitation upon useable optical wavelengths.

In summary, in view of the remarks above, it is desirable that various shortcomings related to traditional lasers and particularly to VCSELs, be addressed.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure and not every similar element is shown in each figure, or replicated in the various figures. The drawings are not necessarily drawn to scale, emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. It should be further understood that certain words and phrases are used herein solely for convenience and such words and phrases should be interpreted as referring to various objects and actions that are generally understood in various forms and equivalencies by persons of ordinary skill in the art. For example, the word "aperture" can be understood in the context described herein as a "through hole" in some instances and a "partially extending hole," or "recess" in other instances. It should also be understood that the word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, a vertical cavity surface emitting laser (VCSEL) in accordance with the disclosure includes a substrate having an aperture that allows light generated in an active layer of the VCSEL to exit the VCSEL after propagation through a first set of semiconductor layers.

The VCSEL further includes an opaque bottom layer that blocks light generated in the active layer and propagated through a second set of semiconductor layers. The opaque bottom layer can be attached to a heat sink for heat dissipation thereby allowing the VCSEL to be operated at high power levels. The active layer is sandwiched between the first set of semiconductor layers and the second set of semiconductor layers. Unlike a traditional VCSEL where only certain wavelengths of light can propagate through a solid substrate that is "transparent" to these particular wavelengths, the aperture provided in the substrate of a VCSEL in accordance with the disclosure allows for propagation of many different wavelengths.

Described below are various exemplary implementations of VCSELs in accordance with the disclosure. Each exemplary implementation incorporates various advantageous features in terms of connectivity and operability, for example.

Figure 1:
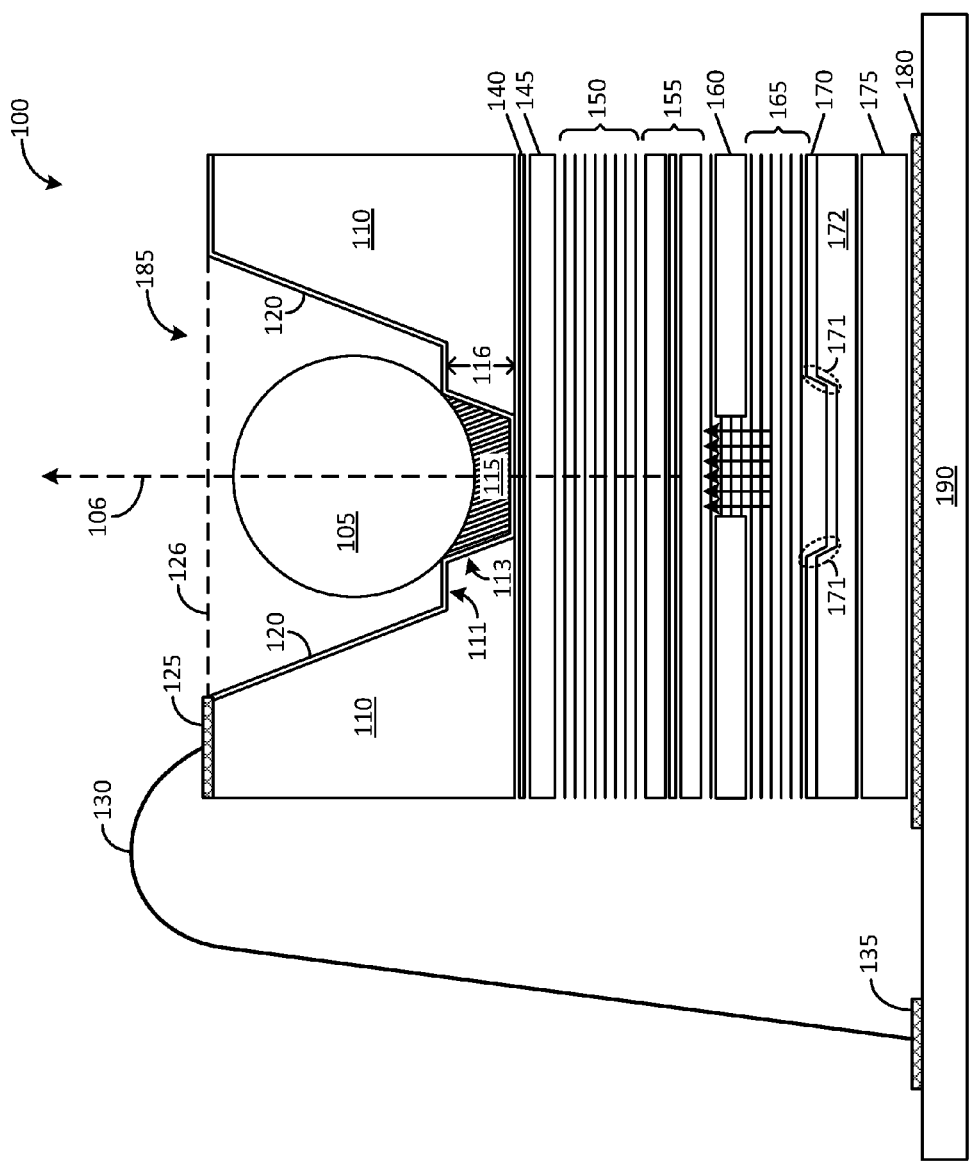
FIG. 1 shows a first exemplary embodiment of a VCSEL that incorporates a substrate having an aperture through which light is emitted out of the VCSEL.

Attention is first drawn to FIG. 1, which shows a first exemplary embodiment of a VCSEL 100 that incorporates a substrate 110 having an aperture 185. The VCSEL 100 is configured for bottom-emission of light out through the aperture 185 along at least a principal optical axis 106. As is known in the art, laser light is generated in an active region of a VCSEL. The active region can be generally defined in terms of various semiconductor layers such as, for example, a multiple quantum well (MQW) layer 155, an n-type distributed Bragg reflector (DBR) layer 150, a p-type DBR layer 165, and a current confinement layer 160 that are shown in FIG. 1. The MQW layer 155 is a part of the active region that constitutes the active layer of the VCSEL 100 where light originates as a result of spontaneous emission. The operation of the active region is known in the art and will not be elaborated upon here in the interest of brevity.

Adjacent to the p-type DBR layer 165 is a p-type contact layer 170 that is located next to a metal contact layer 172. The p-type contact layer 170 can optionally include an etched mesa portion that is defined in part by sloping sides 171 in this exemplary embodiment. The etched mesa portion permits polarization control or index guiding if so desired. Furthermore, the p-type contact layer 170 in conjunction with the metal contact layer 172 enables uniform current injection in the active region of the VCSEL 100. The uniform current injection aspect is shown in the form of the upward pointing arrows, which are also indicative of a direction of optical emission from the VCSEL 100. Furthermore, this arrangement permits uniform temperature distribution and low junction temperature in the active region of the VCSEL 100.

The metal contact layer 172 operates as an opaque bottom layer that blocks light generated in the active region from propagating out of the VCSEL 100 through a bottom half of the semiconductor stack towards the sub-mount 190 (for example, through the p-type DBR layer 165 and the p-type contact layer 170). The metal contact layer 172 also facilitates heat dissipation through a heat sink 175 that can be attached to the metal contact layer 172. The heat sink 175 is mounted on a first bond pad 180 that is located on a major surface of a sub-mount 190. A second bond pad 135 is also located on the major surface of the sub-mount 190 as shown. The second bond pad 135 provides for connection of a bonding wire 130 to an n-type contact 125 located coplanar to an emitting surface 126 of the VCSEL 100.

The emitting surface 126 can be generally viewed as being coplanar with a top major surface of the substrate 110 and a top portion of the aperture 185. The top portion of the aperture 185 has a larger diameter than an opposing bottom portion that is located closer to the active region of the VCSEL 100. More particularly, in this exemplary embodiment, the aperture 185 includes a first tapered bucket portion that is defined by a sloping wall 120 and a second tapered bucket portion that is defined by a sloping wall 113, with a ledge portion 111 delineating the first tapered bucket portion from the second tapered bucket portion. The aperture 185 extends from the top major surface of the substrate 110 to at least an etch stop layer 140. The etch stop layer 140, which can be an AlGaAs etch stop layer, is located adjacent to an n-type current spreading layer 145 on one side and to a bottom surface of the substrate 110 on the other side. In some example implementations, the aperture 185 can extend into the etch stop layer 140, and in yet other example implementations, into the n-type current spreading layer 145.

A ball lens 105 is mounted on the ledge portion 111 of the aperture 185 and is anchored to the etch stop layer 140 by using a suitable epoxy compound 115. The height 116 ("h") of the ledge portion 111 with respect to the etch stop layer 140 can be selected on the basis of various criteria, such as, for example, a diameter of the ball lens 105, focusing parameters associated with the ball lens 105, and the nature of the operation of the ball lens 105 (as a collimating lens or a focusing lens, for example). In one exemplary implementation, the ball lens 105 has a diameter of about 100 micrometers and the height 116 of the ledge portion 111 with respect to the etch stop layer 140 is about 50 micrometers. In this arrangement, light at a wavelength of 850 nanometers can be propagated out of the VCSEL 100 with a diameter of about 30 micrometers.

The ball lens 105 can be placed inside the aperture 185 with a high degree of precision as a result of the geometry of the aperture 185, particularly as a result of the sloping wall 120 and the ledge portion 111. The geometry of the aperture 185 (diameter, depth etc.) is selected such that a top surface of the ball lens 105 is located below the emitting surface 126 of the VCSEL 100. This feature provides a number of advantages during manufacture of the VCSEL 100, such as, for example, protecting the ball lens 105 during die-pick-and-place operations, eliminating interference with wire-bonding operations at the wafer-level, facilitating easier test procedures at the wafer level after completion of wire-bonding operations, and permitting flip-chip related actions during manufacture. This is in contrast to a traditional approach wherein a lens has to be placed in a VCSEL only after completion of certain wafer-level operations such as wire-bonding and die-pick-and-place. Placing the lens in a VCSEL after completion of wafer level operations can typically necessitate chip level testing rather than the more advantageous wafer-level testing.

Turning back to the VCSEL 100, in this exemplary embodiment, the substrate 110 is indicated as an n-type GaAs substrate. However, in other embodiments, materials other than GaAs can be used instead. Irrespective of the nature of the material chosen for the substrate 110, it is desirable that an operating wavelength of the VCSEL 100 be located below an absorbing threshold of the substrate 110. In various exemplary embodiments wherein a suitable material is used for the substrate 110, the VCSEL 100 can be operated at wavelengths ranging from about 760 nm to about 1060 nm.

Figure 2:
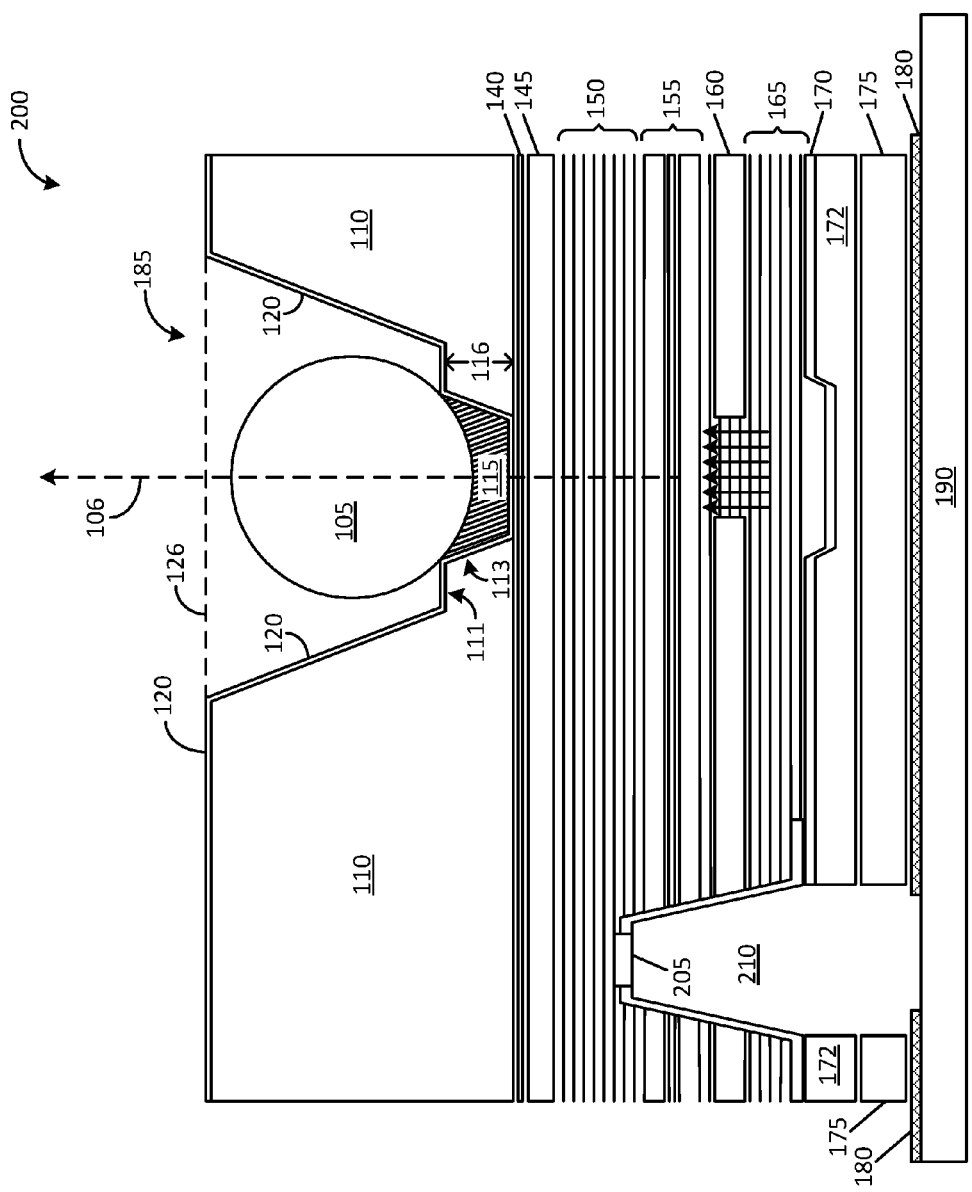
FIG. 2 shows a second exemplary embodiment of a VCSEL that incorporates a substrate having an aperture through which light is emitted out of the VCSEL.

FIG. 2 shows a second exemplary embodiment of a VCSEL 200 that also incorporates the substrate 110 and the aperture 185. The light generating and light emitting portions of the VCSEL 200 are similar to that of the VCSEL 100 described above and will therefore not be repeated here in the interest of brevity. However, in contrast to the VCSEL 100 where the bonding wire 130 is attached to the n-type contact 125 that is located coplanar to the emitting surface 126 of the VCSEL 100, in this second exemplary embodiment, the VCSEL 200 incorporates an n-type contact 205 that is located within the semiconductor stack. As described above, the semiconductor stack includes various layers such as the (MQW) layer 155, the n-type DBR layer 150, the p-type DBR layer 165, and the current confinement layer 160, and the n-type contact 205 can be located within one or more of these layers as found suitable.

In this exemplary implementation, the n-type contact 205 is located in the n-type DBR layer 150, and is provided inside a recess 210 that is accessible from the sub-mount 190. Furthermore, in this exemplary implementation, the recess 210 has an inverted bucket shape with a larger end of the inverted bucket located closer to the sub-mount 190 and a smaller end of the inverted bucket accommodating the n-type contact 205. The recess 210 not only provides a protective environment for a wire connection or other type of connection that can be made between the n-type contact 205 and the bond pad 180 located on the sub-mount 190, but also eliminates certain operations associated with wire bonding an external wire bond such as the wire bond 130 shown in FIG. 1.

Figure 3:
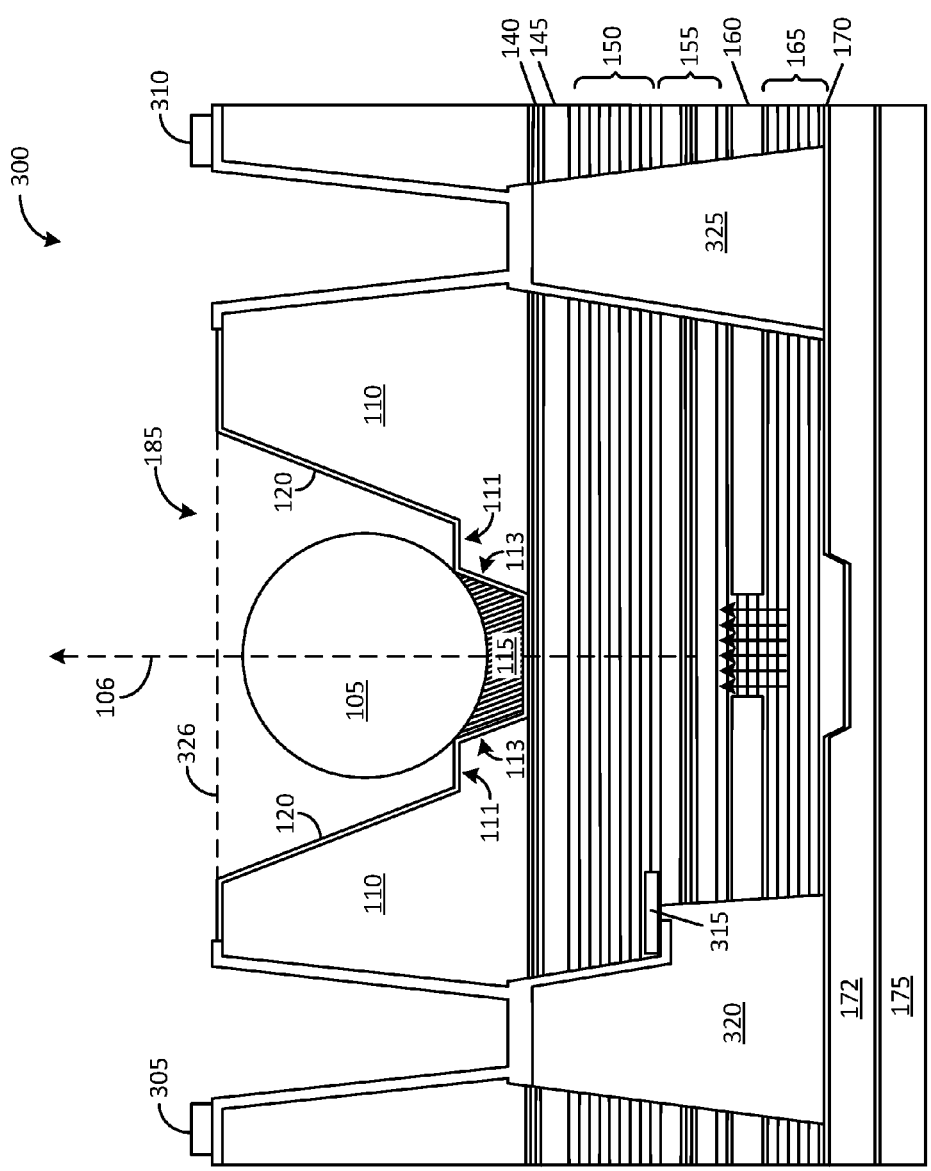
FIG. 3 shows a third exemplary embodiment of a VCSEL that incorporates a substrate having an aperture through which light is emitted out of the VCSEL.

FIG. 3 shows a third exemplary embodiment of a VCSEL 300 that also incorporates the substrate 110 and the aperture 185. The light generating and light emitting portions of the VCSEL 300 are similar to that of the VCSEL 100 described above and will therefore not be repeated here in the interest of brevity. However, in this third exemplary embodiment, a p-type contact 310 as well as an n-type contact 305 are located coplanar to the emitting surface 326 of the VCSEL 300. In this arrangement, an n-type contact 305 and a p-type contact 310 straddle the aperture 185. Furthermore, a pair of recesses, specifically, a first recess 320 and a second recess 325, are provided inside the semiconductor stack. The first recess 320 includes a ledge portion inside the semiconductor stack. An n-type contact 315 is provided on this ledge portion.

Figure 4:
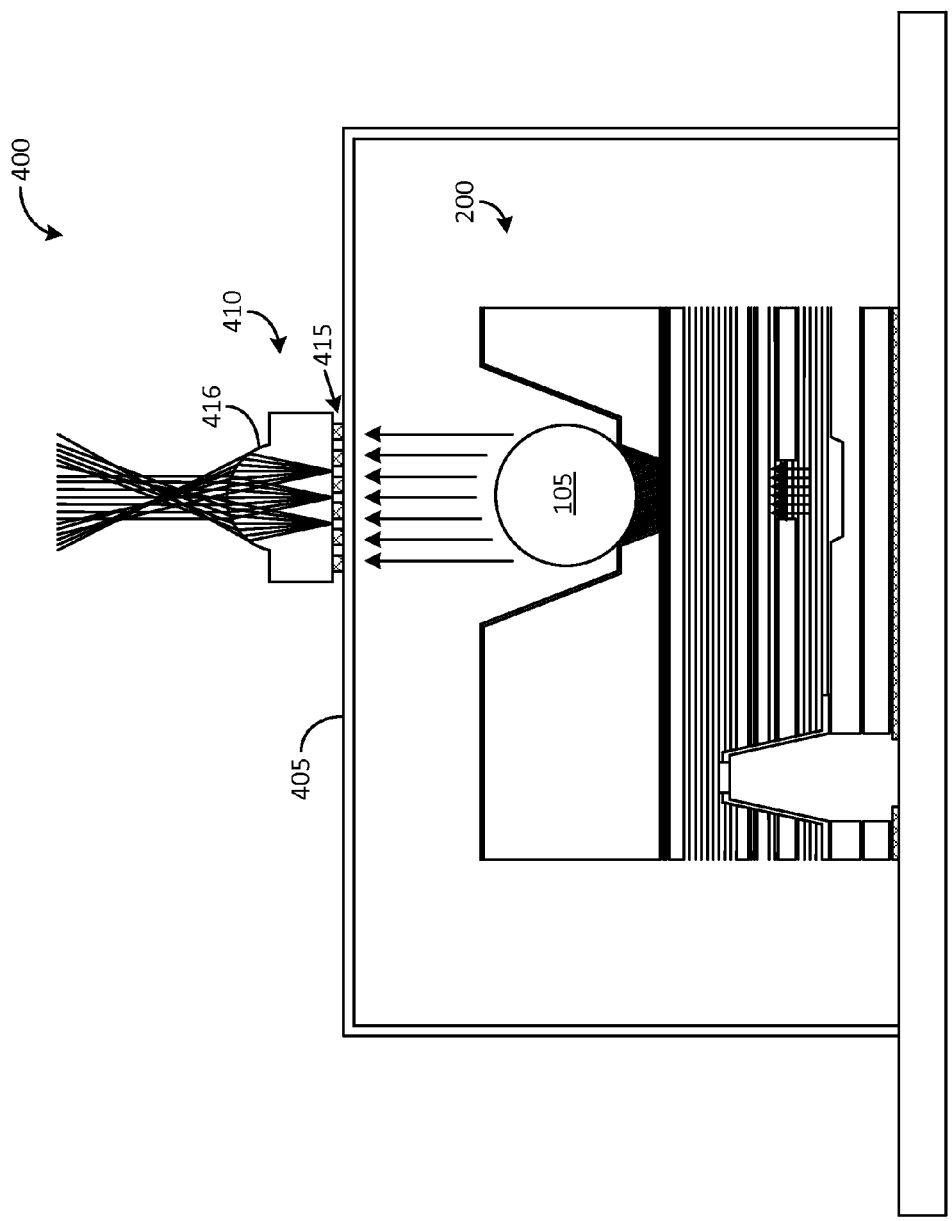
FIG. 4 shows an exemplary optical device that incorporates a VCSEL in accordance with the disclosure, together with one or more additional components.

FIG. 4 shows an exemplary optical device 400 that includes a VCSEL located inside an enclosure 405. A top surface of the enclosure 405 operates as a mounting platform for mounting various components, such as, for example, a projection lens 410. The VCSEL located inside an enclosure 405 can be any of the VCSELs described herein in accordance with the disclosure. In this exemplary illustration, the VCSEL is the VCSEL 200 that is described above and the lens 105 that is incorporated into the VCSEL 200 is a collimating lens that propagates a collimated beam of light towards the projection lens 410. The projection lens 410 includes a diffractive optical element (DOE) 415 and a refractive lens 416. The projection lens 410, and particularly the DOE 415 that is arranged in alignment with the collimated beam of light propagated by the lens 105, can be selected in accordance with various desired functionalities.

In a first example implementation, the DOE 415 can be a non-imaging diffuser that operates as a barrier to prevent a human being from suffering eye injury as a result of looking directly at the laser beam emitted by the VCSEL 200. In addition to providing eye injury protection, the DOE 415 diffuses the laser beam emitted by the VCSEL 200 and projects the diffused light over a larger illumination field at one or more predefined angles.

In a second example implementation, the DOE 415 can be a beam shaping element that is used for generating various light patterns. For example, the DOE 415 can be used in a three-dimensional (3D) sensing device for generating one or more defined two-dimensional (2D) light patterns that are used for sensing one or more objects.

Figure 5:
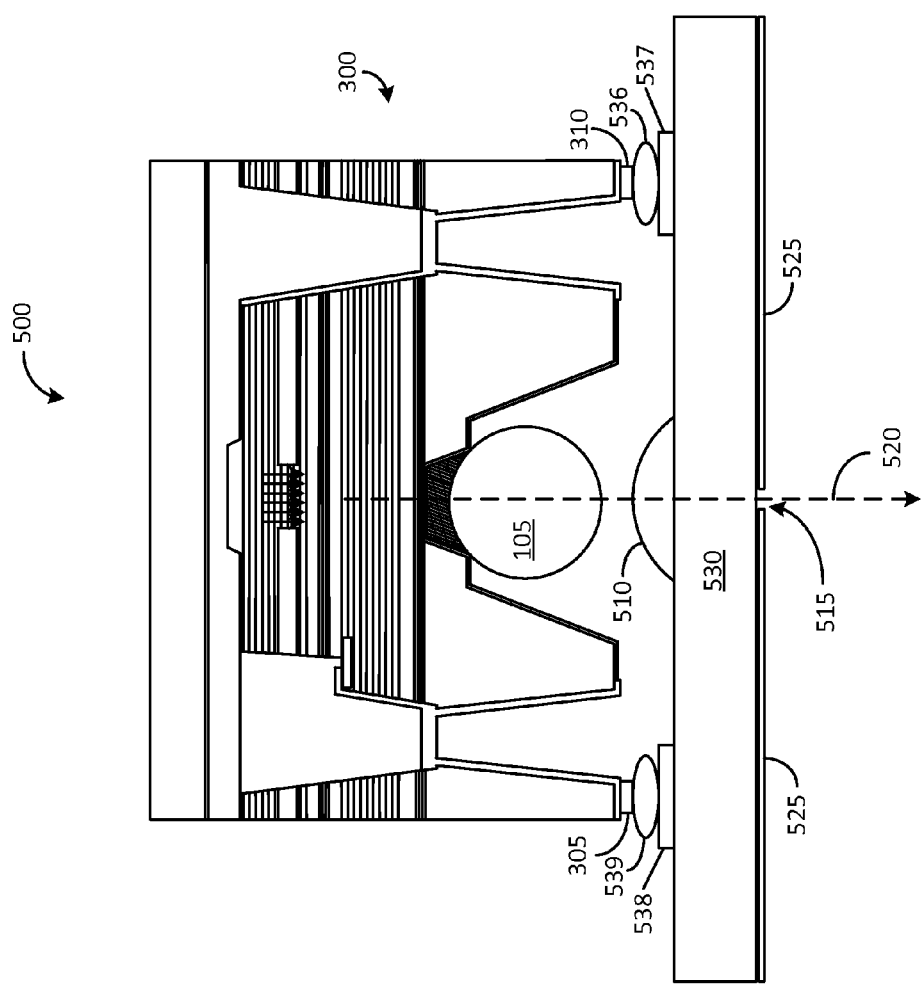
FIG. 5 shows another exemplary optical device that incorporates a VCSEL in accordance with the disclosure, together with one or more additional components.

FIG. 5 shows an exemplary optical device 500 that incorporates a VCSEL propagating light towards a sub-mount upon which the VCSEL is mounted. In this exemplary illustration, the VCSEL is the VCSEL 300 that is described above. The p-type contact 310 is attached to a glass sub-mount 530 by using a mounting pad 537 and solder 536. The n-type contact 305 is similarly attached to the glass sub-mount 530 by using a mounting pad 538 and solder 539. The lens 105 which is a part of the VCSEL 300 propagates light along a principal optical axis 520. A second lens 510 is mounted on a major surface of the sub-mount 530 such that an optical axis of the second lens 510 coincides with the principal optical axis 520. A conductive metallic film 525, which is provided on an opposing major surface, includes an aperture 515 through which light is propagated out of the optical device 500 along the principal optical axis 520.

The aperture 515 provided in the conductive metallic film 525 allows the optical device 500 to operate as a very small aperture laser (VSAL). Accurate alignment of the optical axis 520 with the aperture 515 can be achieved in various ways, such as for example, through a self-alignment action of the n-type contact 305 and the p-type contact 310 when the solder 537 and the solder 539 are subjected to a solder re-flow process.

Figure 6:
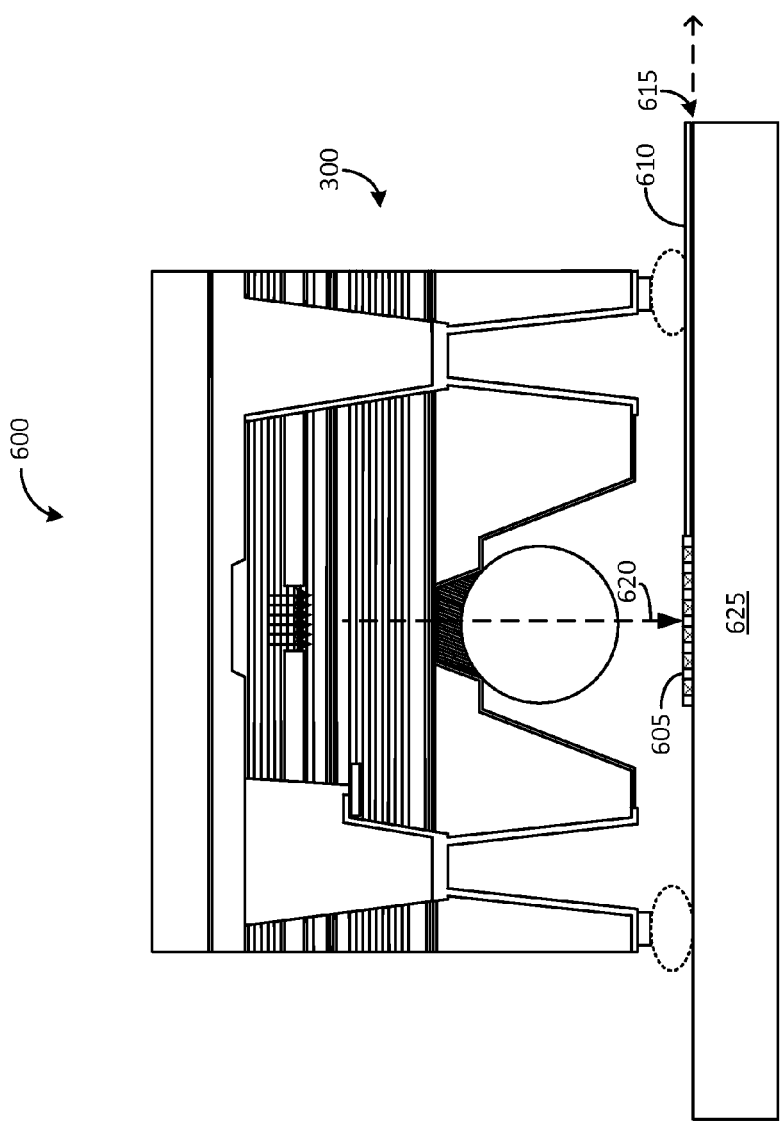
FIG. 6 shows yet another exemplary optical device that incorporates a VCSEL in accordance with the disclosure, together with one or more additional components.

FIG. 6 shows an exemplary optical device 600 that is a variant of the optical device 500 described above. In this exemplary embodiment, the light emitted by the VCSEL 300 along a principal optical axis 620 is incident upon an optical grating 605 that is located on the sub-mount 625 or is an integral part of the sub-mount 625. The optical grating 605 directs light received from the VCSEL 300 into an optical waveguide 610 that can be an integral part of the sub-mount 625 as well. A sub-wavelength aperture 615 is provided at a light emitting facet of the optical waveguide 610, thus light with a sub-wavelength size can be propagated out of the sub-wavelength aperture 615.

Figure 7A:
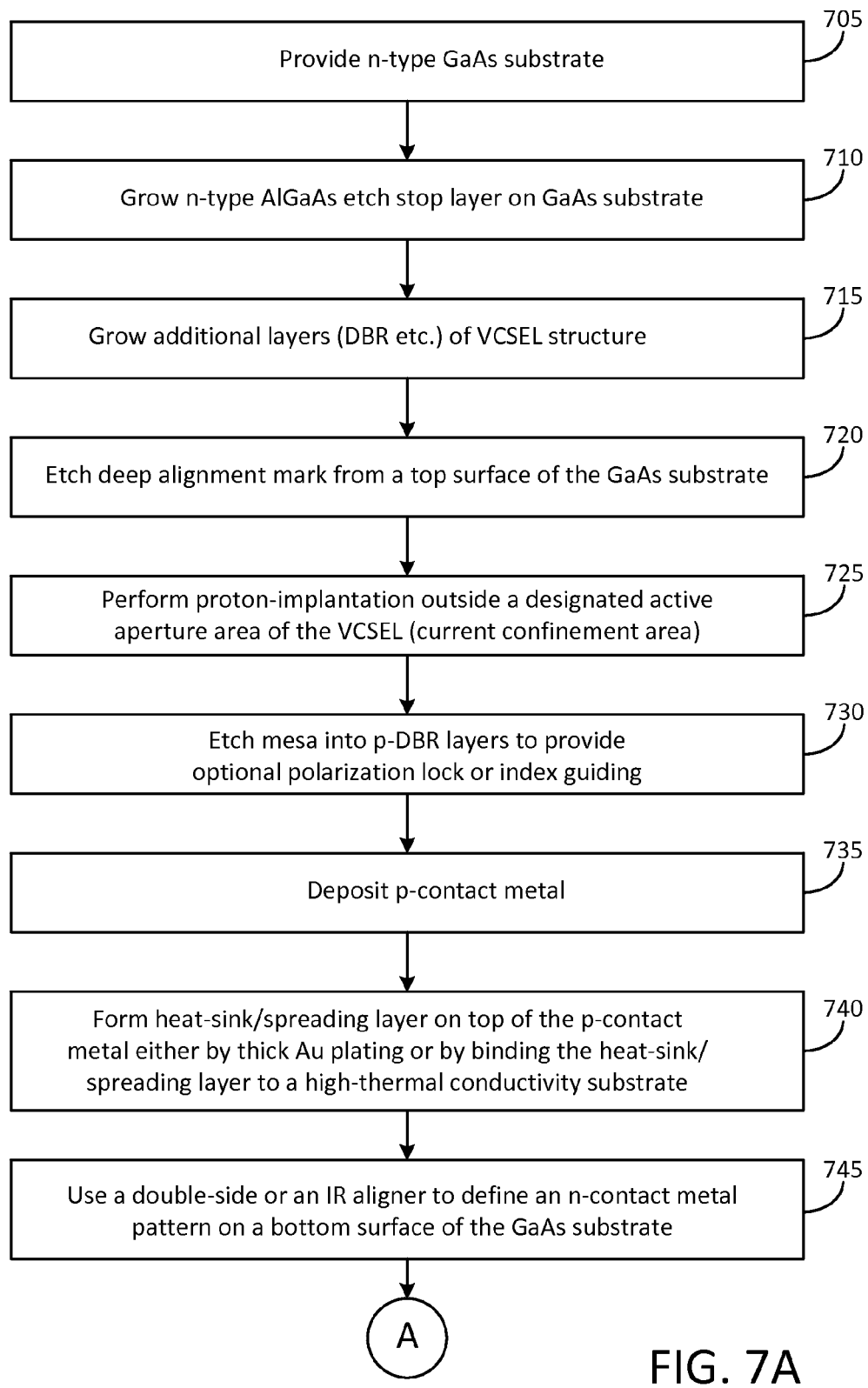
FIGS. 7A and 7B shows a flowchart that describes various steps associated with a method of fabricating a VCSEL in accordance with the disclosure.
Figure 7B:
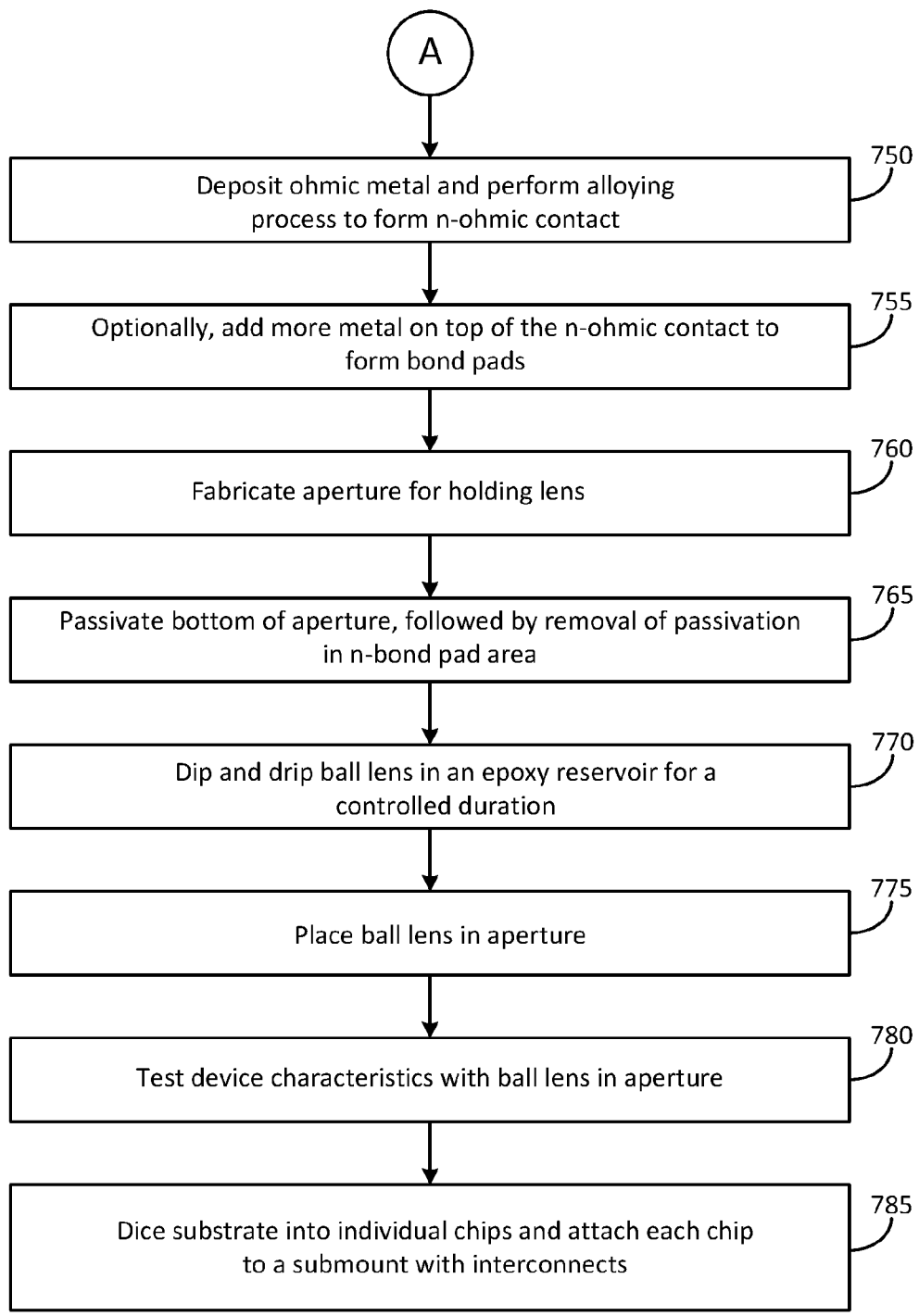

FIGS. 7A and 7B shows a flowchart that describes various steps associated with a method of fabricating a VCSEL in accordance with the disclosure. In step 705, an n-type GaAs substrate is provided. In step 710, an n-type AlGaAs etch stop layer is epitaxial grown upon the n-type GaAs substrate, followed by step 715 where additional layers corresponding to the semiconductor stack (DBR layer, MQW layer etc.) are epitaxially grown upon the n-type AlGaAs etch stop layer. In step 720, an etch deep alignment mark is provided upon an exposed top surface of the n-type GaAs substrate. This is followed by step 725, where proton implementation is performed outside a designated active aperture area of the VCSEL that corresponds to a current confinement area of the VCSEL. In step 730, a mesa is etched into a p-type DBR layer if polarization-lock or index-guiding is desired, followed by step 735, where a metal layer in the form of a p-type contact is deposited. In step 740, a heat sink is provided on a top surface of the metal layer, by processes such as, for example, a thick gold plating or by binding the heat sink to a high thermal conductivity sub-mount. In step 745, an infra-red (IR) aligner can be used to define an n-contact metal pattern on a bottom surface of the sub-mount, followed by step 750 where ohmic metal is deposited followed by an alloying process for forming an n-type contact. In step 755, additional metal may be optionally added on top of the n-type contact so as to form bond pads.

In step 760, an aperture is fabricated in the substrate for accommodating a ball lens. In step 765, a bottom portion of the aperture is passivated, followed by removal of passivation in an n-type bond pad area. In step 770, the ball lens is dipped into an epoxy reservoir and excess epoxy is allowed to drip off the ball lens for a controlled duration. In step 775, the ball lens is placed in the aperture. Upon completion of step 775, in step 780, a test procedure is executed for testing the VCSEL with the ball lens in place. This can be carried out by placing probes in contact with a wafer on which multiple VCSELs are being batch manufactured. In step 785, die singulation is carried out to dice the wafer into individual VCSELs, and the individual VCSELs are attached to a submount with wire bond interconnects.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, though the aperture is a circular aperture in the various embodiments described herein, in various other embodiments, the aperture can be for example, an oval shaped aperture or a quadrilateral shaped aperture. Furthermore, the walls of the aperture can not only be smooth surfaces as shown in the various figures, but can have various irregular shapes in various implementations. Persons of skill in the art will understand that many such variations can be made to the illustrative embodiments without deviating from the scope of the invention.

What is claimed is:

1. A vertical cavity surface emitting laser (VCSEL) comprising:
    an active layer sandwiched between a first plurality of semiconductor layers and a second plurality of semiconductor layers;
    a growth substrate having an aperture that extends from a first major surface of the growth substrate to at least a first major surface of a first semiconductor layer among the first plurality of semiconductor layers, wherein the aperture includes a ledge portion that delineates a first tapered bucket portion of the aperture from a second tapered bucket portion of the aperture; and
    an opaque bottom layer configured to block light that is generated in the active layer and propagated through the second plurality of semiconductor layers.

2. The VCSEL of claim 1, wherein the light generated in the active layer comprises light of a first wavelength and the growth substrate is opaque to light of at least the first wavelength, and further wherein the aperture in the growth substrate is arranged to allow the light generated in the active layer to exit the VCSEL after propagation through the first plurality of semiconductor layers.

3. The VCSEL of claim 1, wherein the opaque bottom layer is a metal layer.

4. The VCSEL of claim 3, further comprising a heat sink that is attached to the metal layer for heat dissipation.

5. The VCSEL of claim 1, wherein the aperture has a first diameter at the first major surface of the growth substrate, the first diameter larger than a second diameter at a second major surface of the growth substrate.

6. The VCSEL of claim 5, wherein the second major surface of the substrate abuts the first major surface of the first semiconductor layer.

7. The VCSEL of claim 1 further comprising a lens mounted on the ledge portion.

8. The VCSEL of claim 7, wherein the lens is a ball lens.

9. The VCSEL of claim 1, wherein the aperture extends from the first major surface of the growth substrate to an interior portion of the first semiconductor layer.

10. The VCSEL of claim 9, wherein the first semiconductor layer is one of an etch stop layer, a current spreading layer, or a distributed Bragg reflector (DBR) layer.

11. A vertical cavity surface emitting laser (VCSEL) comprising:
    an active layer sandwiched between a first plurality of semiconductor layers and a second plurality of semiconductor layers;
    a growth substrate having an aperture configured to allow light generated in the active layer to exit the VCSEL after propagation through the first plurality of semiconductor layers, wherein a portion of the aperture is configured to hold a lens through which light generated in the active layer of the VCSEL exits the VCSEL, wherein the portion of the aperture that is configured to hold a lens comprises a ledge portion that delineates a first tapered bucket portion of the aperture from a second tapered bucket portion of the aperture; and
    an opaque bottom layer configured to block light that is generated in the active layer and propagated through the second plurality of layers.

12. The VCSEL of claim 11, wherein the light generated in the active layer comprises light of a first wavelength, and wherein the growth substrate is opaque to light of at least the first wavelength.

13. The VCSEL of claim 12, wherein the growth substrate comprises GaAs.

14. The VCSEL of claim 11, wherein the opaque bottom layer is a metal layer, and wherein the aperture has a first diameter at a first major surface of the growth substrate that is larger than a second diameter at a second major surface of the growth substrate, the second major surface of the growth substrate abutting the first plurality of semiconductor layers.

15. The VCSEL of claim 14, wherein the aperture extends from the first major surface of the growth substrate and through the second major surface of the growth substrate.

16. The VCSEL of claim 15, wherein the aperture extends through the second major surface of the growth substrate and into at least a portion of a first semiconductor layer among the first plurality of semiconductor layers.

17. The VCSEL of claim 11, wherein at least a portion of the second tapered bucket portion contains an epoxy material for holding a lens mounted on the ledge portion.

18. A vertical cavity surface emitting laser (VCSEL) comprising:
    a growth substrate having a hole extending through the growth substrate, the hole configured to allow light generated in an active layer of the VCSEL to exit the VCSEL, wherein at least a portion of the hole has slanting side walls defined at least in part by a first tapered bucket portion that is delineated from a second tapered bucket portion by a ledge portion, the ledge portion configured to accommodate a lens;
    a lens through which light generated in the active layer of the VCSEL exits the VCSEL disposed in the hole; and
    an opaque bottom layer located on an opposing side of the VCSEL, the opaque bottom layer configured to block light generated in the active layer of the VCSEL.

19. The VCSEL of claim 18, wherein the light generated in the active layer comprises light of a first wavelength and the growth substrate is opaque to light of at least the first wavelength.

20. The VCSEL of claim 18, wherein the hole comprises at least one of a circular section, an oval section, or a quadrilateral section.

21. The VCSEL of claim 18, wherein at least a portion of the hole has slanting side walls.

22. The VCSEL of claim 18, wherein the lens is located below a major surface of the growth substrate.

23. The VCSEL of claim 22, wherein the lens is a ball lens.

24. The VCSEL of claim 18, wherein the opaque bottom layer is a metal layer, and wherein the hole has a first diameter at a first major surface of the growth substrate that is larger than a second diameter at a second major surface of the growth substrate, the second major surface of the growth substrate located closer to the active layer than the first major surface of the growth substrate.

25. A vertical cavity surface emitting laser (VCSEL) comprising:
- an active layer sandwiched between a first plurality of semiconductor layers and a second plurality of semiconductor layers;
- a substrate having an aperture that extends from a first major surface of the substrate to at least a first major surface of a first semiconductor layer among the first plurality of semiconductor layers, the aperture including a ledge portion that delineates a first tapered bucket portion of the aperture from a second tapered bucket portion of the aperture; and
- an opaque bottom layer configured to block light that is generated in the active layer and propagated through the second plurality of semiconductor layers.

* * * * *